United States Patent [19]

Mamine et al.

[11] 3,990,100
[45] Nov. 2, 1976

[54] SEMICONDUCTOR DEVICE HAVING AN ANTIREFLECTIVE COATING

[75] Inventors: Takayoshi Mamine, Tokyo; Takeshi Matsushita, Sagamihara, both of Japan

[73] Assignee: Sony Corporation, Tokyo, Japan

[22] Filed: Oct. 2, 1975

[21] Appl. No.: 619,054

[30] Foreign Application Priority Data
Oct. 9, 1974 Japan .............................. 49-116418

[52] U.S. Cl. .................................. 357/30; 357/54; 357/59
[51] Int. Cl.² .......................................... H01L 27/14
[58] Field of Search .......................... 357/30, 59, 54

[56] References Cited
UNITED STATES PATENTS

| | | | |
|---|---|---|---|
| 3,743,847 | 7/1973 | Boland | 250/510 |
| 3,760,240 | 9/1973 | Bergt | 317/235 R |
| 3,886,587 | 5/1975 | Nicolay | 357/49 |
| 3,900,350 | 8/1975 | Appels | 148/175 |
| 3,922,774 | 12/1975 | Lindmayer | 29/572 |

OTHER PUBLICATIONS

B535,209, Mar. 1976, Kajiwara, 357/59.
B561,405, Mar. 1975, Janowiecki, 148/174.

Primary Examiner—Martin H. Edlow
Attorney, Agent, or Firm—Hill, Gross, Simpson, Van Santen, Steadman, Chiara & Simpson

[57] ABSTRACT

A polycrystalline silicon layer provides an antireflective coating on a semiconductor surface of a photosensitive detector, the polycrystalline silicon layer containing from 25 to 45 atomic percent of oxygen and having a refractive index intermediate that of the semiconductor crystal and the exterior environment.

8 Claims, 6 Drawing Figures

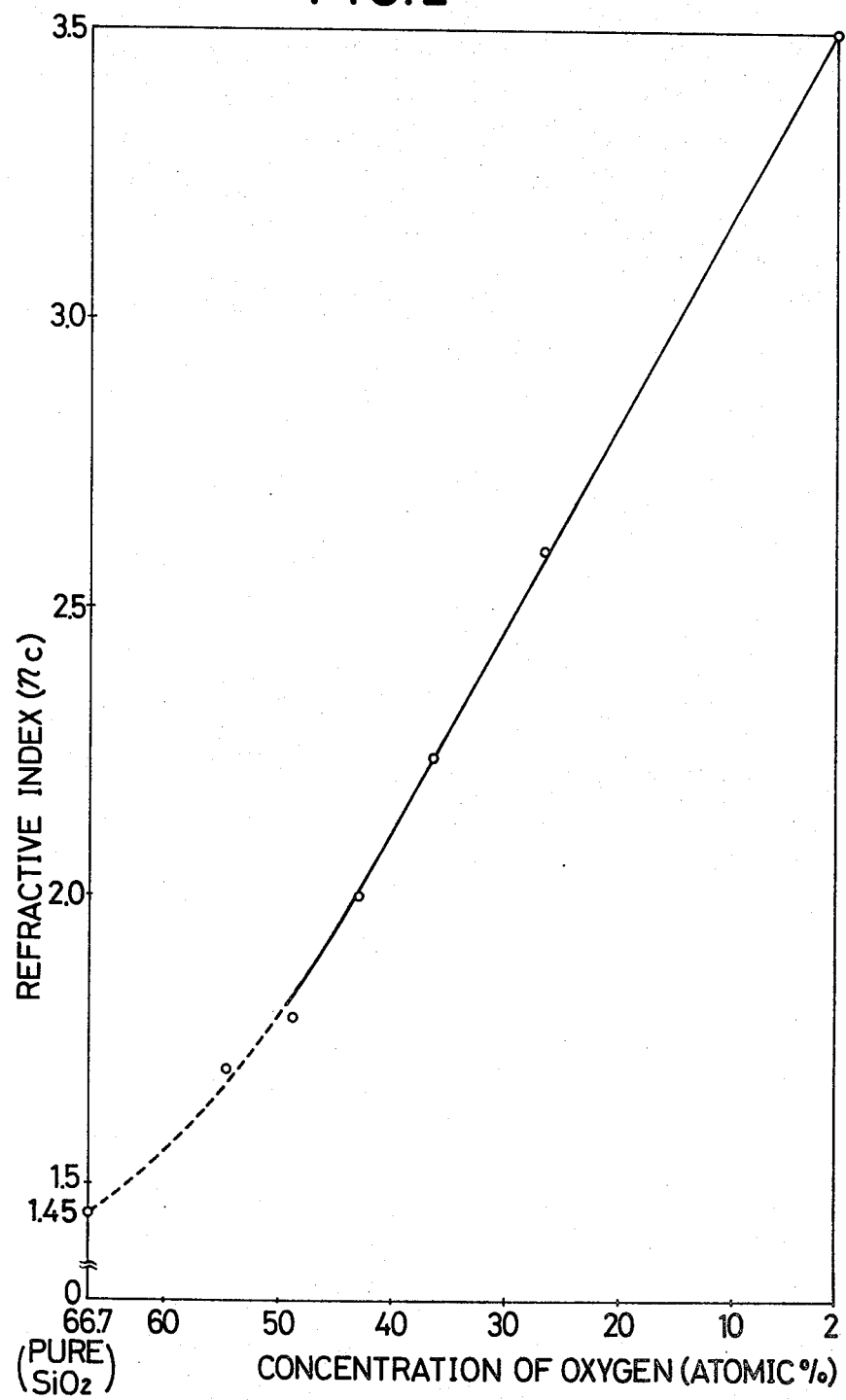

SEMICONDUCTOR DEVICE HAVING AN ANTIREFLECTIVE COATING

CROSS REFERENCE TO RELATED APPLICATION

This application contains disclosure similar to that found in U.S. Ser. No. 561,532 filed Mar. 24, 1975 by one of the present applicants and others, the application being assigned to the assignee of the present application.

BACKGROUND OF THE INVENTION

Field of the Invention

This invention is in the field of semiconductor photoelectric transducers or photo detectors, and more particularly relates to a solar cell, a charge coupled imaging device, a photo diode or a photo transistor which is provided with an antireflective coating layer having superior optical and electrical characteristics.

DESCRIPTION OF THE PRIOR ART

It is well known that a single P-N junction type semiconductive photo detector, for example, a single crystal silicon solar cell, has a limit conversion efficiency of 25% because of various types of losses occuring during energy conversion operations.

Since silicon with a mirror surface tends to reflect incident light, the reflection losses on the surface are more than 35.4% in range of wavelengths for operating a solar cell, without the cell having a surface antireflective coating on it.

It is accordingly desirable to form a colorless and transparent antireflective coating layer on the surface of the silicon body to reduce such losses. In order to improve the transmissivity of photons passing through the boundary between two media with different optical characteristics, a layer having a refractive index intermediate the two, and a smaller absorption coefficient should be provided between the two media.

The lowest reflection losses ae obtained when the following equations are satisfied:

$$n_c = \sqrt{n_s n_a} \quad (1)$$

$$n_c \cdot d_c = \gamma 4 \quad (2)$$

where $n_c$, $n_s$ and $n_a$ are the refractive indices for the intermediate coating layer, the silicon and air respectively, $d_c$ is the thickness of the layer, and $\gamma$ is the peak wavelength of the incident light.

It is also well known that the refractive index of silicon varies with the frequency of the incident light. When sunlight is used as the incident light, calculations from Equations 1 and 2 with an $n_s$ of 3.4 to 4.0 in the range of wavelengths of sunlight and an $n_a$ of 1.0 show that the refractive index of the intermediate layer, $n_c$, should be in the range from 1.8 to 2.0. Consequently, the thickness should be in the range from 600 to 667 Angstroms with a wavelength of 4800 Angstroms.

The refractive index for silicon monoxide satisfies the above-mentioned relationship, but this material has poor passivation effect because a number of boundary surface states existing between SiO and Si lead to large surface recombination velocities of the generated pairs at the boundary. In place of SiO, silicon dioxide may be applied as the intermediate layer, but it has undesirable optical characteristics such as a refractive index of about 1.45.

SUMMARY OF THE INVENTION

The present invention provides a semiconductor device with an antireflective coating layer or layers by means of which its conversion efficiency is increased. Through the use of the present invention, the thickness and refractive index of the antireflective coating can be optimized so that absorption losses and reflection losses are virtually eliminated, thermal distortion is avoided, surface recombination velocity is smaller than in the case of SiO, and passivation and stabilization effects are improved.

The present invention provides a semiconductor device which includes a semiconductor of single crystal substrate having a polycrystalline silicon layer containing from 25 to 45 atomic percent oxygen. The expression "atomic percent" as used in the specification is in accordance with its normal definition, namely, percentage of oxygen atoms as compared with the total amount of silicon plus oxygen atoms.

The mean grain size of the polycrystalline silicon is less than 1,000 Angstroms and is preferably in the range from 100 to 1,000 Angstroms. In this range, the oxygen atoms are distributed uniformly throughout the lattice of the polycrystalline silicon.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure and in which:

FIG. 2 is a plot of the refractive index against concentration of oxygen in the antireflective coating layer produced according to this invention;

DESCRIPTION OF THE PREFERRED EMBODIMENTS

Figure 1:
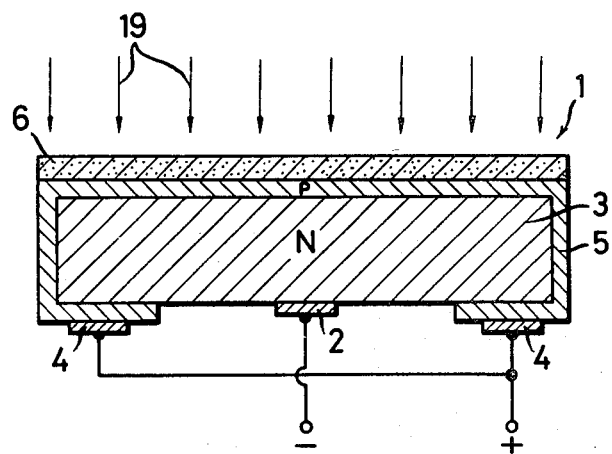
FIG. 1 is a cross-sectional view of a solar cell produced according to one embodiment of the present invention.

One embodiment of the present invention as applied to a solar cell will be described in conjunction with FIGS. 1 to 4 of the drawings. In FIG. 1, there is shown a semiconductor substrate3 substrate 3 of an N-type silicon with a relatively low concentration of impurities. A metal electrode 2 is deposited on the surface of the semiconductor substrate 3. A P-type semiconductive region 5 with higher concentration of impurities is formed on the semiconductor substrate 3 by diffusion of P-type impurities into the semiconductor substrate 3 or by epitaxial growth of a P-type semiconductive layer. Another metal electrode 4 is deposited on one surface of the P-type semiconductor region 5. A polycrystalline silicon layer 6 containing oxygen uniformly distributed therein is formed on the other or external surface of the P-type semiconductor region 5 by a vapor growth method to be described. The polycrystalline silicon layer 6 may contain about 42 atomic percent oxygen and has a total refractive index of 2.0. The polycrystalline silicon layer 6 is formed in parallel with the P-N junction in the device.

As shown in FIG. 2 which plots the refractive index of polycrystalline silicon containing oxygen atoms with the concentration of oxygen, the above-mentioned value of refractive index satisfies equation (1) substantially, and leads to a thickness of 634 Angstroms from equation (2). Various experiments have lead to the conclusion that the absorption efficiency of the polycrystalline silicon containing oxygen atoms is reduced particularly in the thickness range of 600 to 1,000 Angstroms.

Figure 3:
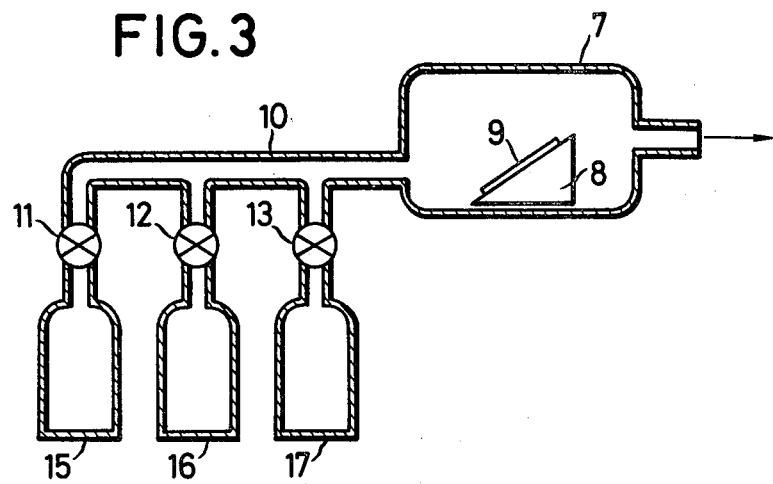
FIG. 3 is a schematic sketch of a vapor deposition apparatus which can be used for the purposes of the present invention.

The formation of the polycrystalline silicon layer 6 is described with reference to FIG. 3. A gaseous silicon source such as monosilane ($SiH_4$) is delivered from a tank 16, a source of oxygen such as dinitrogen monoxide $N_2O$ is delivered from a tank 17, and a carrier gas such as nitrogen is delivered from a tank 15. The various gases are fed through suitable valves 11, 12 and 13 through a conduit 10 feeding a vapor growth apparatus or furnace 7. The semiconductor substrates 9 having P-N junctions therein are disposed on supports 8.

The semiconductor substrate 9 in the furnace 7 is heated to a temperature range of from 600° to 750° C, and preferably at about 650° C for the growth of the polycrystalline layer. Since the growing temperature is relatively low, there is little possibility that impurities in the semiconductor substrate will be doped into the polycrystalline silicon layer 6.

At temperatures below 600° C, the growth rate is too slow for practical purposes. At temperatures above about 800° C, the growth rate is too high and the control of the thickness of the polycrystalline layer 6 is very difficult. In addition, the grain size of the polycrystalline silicon layer becomes too large to provide the most desirable characteristics.

Polycrystalline silicon is deposited onto the semiconductor substrate by the thermal decomposition of the monosilane. At the same time, oxygen atoms derived from the dinitrogen monoxide are substantially uniformly mixed into the polycrystalline silicon.

Numerous polycrystalline silicon layers containing different amounts of oxygen can be formed on the semiconductor substrate. For example, the ratio of $N_2O$ to $SiH_4$ can be set at 0, ⅓, 1, 2, 5 and 10 to produce the various concentrations of oxygen in the polycrystalline substrate, and correspondingly different refractive indices. The relationship between the ratio of dinitrogen methoxide and monosilane to these variables is expressed in the following table:

TABLE 1

| Ratio of $N_2O/SiH_4$ | Concentration of Oxygen (atomic %) | Refractive Index $n_c$ |
|---|---|---|
| 0 | 0 | 4.0 |
| ⅓ | 26.8 | 2.6 |
| 1 | 36.4 | 2.23 |
| 2 | 44.0 | 1.89 |
| 5 | 48.6 | 1.78 |
| 10 | 54.7 | 1.57 |

The above results were obtained with an X-ray microanalyzer having a 10 KV acceleration voltage and a 1 micron beam diameter. The concentration of oxygen in atomic percent increases as the logarithm of the ratio of dinitrogen monoxide to monosilane. Oxygen was almost uniformly distributed in all of the polycrystalline silicon layers and was not isolated. Thus, an antireflective layer having the optimum refractive index can easily be obtained by controlling the relative ratio of dinitrogen monoxide to monosilane. This is clearly shown in FIG. 2 from which it is apparent that the refractive index of the polycrystalline silicon layer can be at a value of from 1.8 to 2.6 by controlling this flow ratio. In the case of conventional silicon monoxide, the refractive index is fixed at a value of 2.0.

Figure 4:
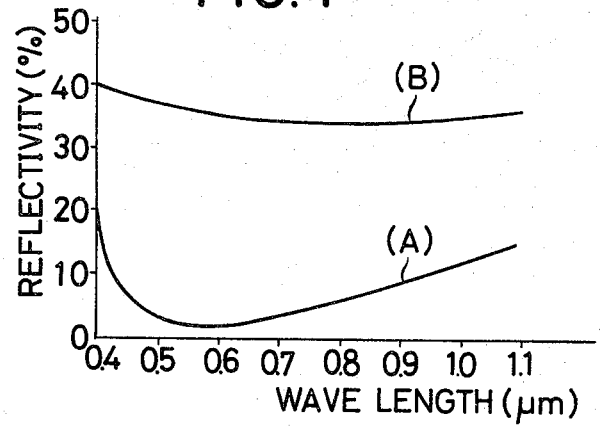
FIG. 4 is a graph plotting reflectivity in percent against incident wavelengths for semiconductor devices with and without the coating layer of the present invention.

As shown in FIG. 4, the reflectivity at the peak wavelength of sunlight for a solar cell having the polycrystalline silicon coating layer of the present invention is about 2% while it is significantly higher without the layer.

It has been found from the foregoing that a number of the electron-hole pairs generated due to incident photon absorption are separated by the electric field of the P-N junction and collected effectively. Accordingly, the output capacity is increased to a large extent.

Figure 6:
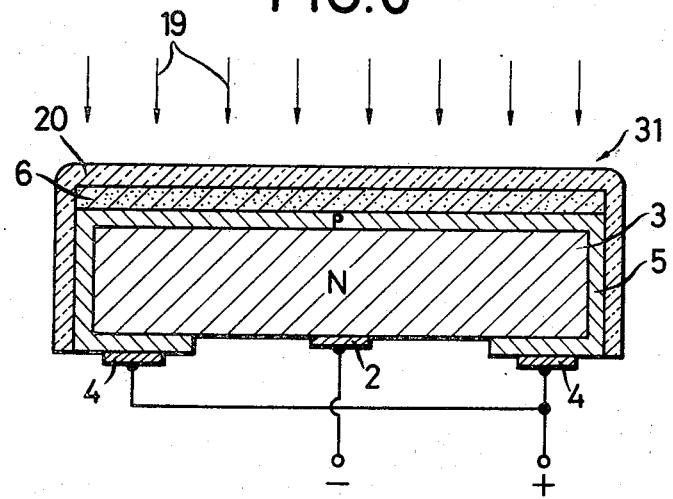
FIG. 6 is a cross-sectional view of a solar cell produced according to a still further embodiment of the present invention.

Another structure of solar cell has been identified at reference numeral 31 in FIG. 6. The silicon dioxide $SiO_2$ layer 20 is formed on the polycrystalline silicon layer 6 to provide an improved water resistance to the cell as compared to the cell of FIG. 1 in which the polycrystalline layer of silicon is exposed. Moreover, since the refractive index of $SiO_2$ is 1.45, the refractive index of the intermediate polycrystalline silicon layer 6 can be easily selected to satisfy equation (1) by controlling the ratio of dinitrogen monoxide to monosilane.

Figure 5:
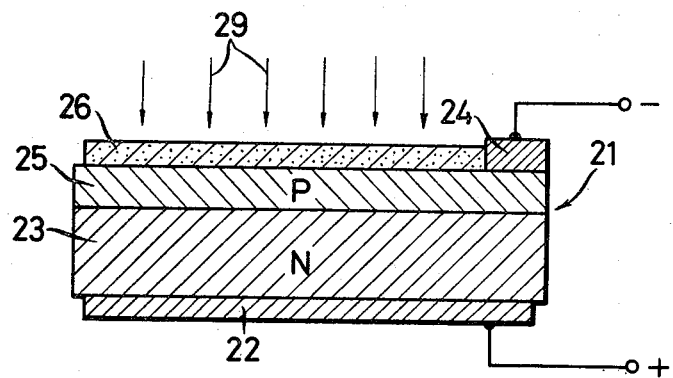
FIG. 5 is a cross-sectional view of a photo diode according to another embodiment of the present invention.

FIG. 5 shows the invention applied to a photo diode. As seen in this figure, a polycrystalline silicon layer 26 is formed on a surface of a P-type region 25 on an N-type substrate 23 of a diode 21. Two electrodes 22 and 24 are deposited on the surface of the N-type substrate 23 and the P-type region 25, respectively. With the P-N junction reverse biased, the minority carriers generated by photon absorption due to the incident light give rise to a saturation current flow across the P-N junction and a power output. In this case, since the refractive index of the polycrystalline silicon is about 2.0, little reflective loss, high power output, and good passivation effects can be obtained.

The invention can also be applied to a photo transistor which comprises an emitter, an electrically floating base, a collector and a biasing means contacting the emitter and the collector, in order to bias the emitter base junction forwardly and the collector base junction reversely. The polycrystalline silicon layer of the present invention is formed on the emitter of the photo transistor. This structure is very similar to the diode shown in FIG. 5.

The invention can also be applied to a charge-coupled imaging device in which the polycrystalline silicon layer of the invention is provided as a coating on a surface of the photo sensor regions of the charge-coupled device.

Although certain embodiments of the present invention have been described, it will be understood that various modifications are possible. For example, instead of using dinitrogen monoxide, nitrogen dioxide ($NO_2$) nitrogen monoxide (NO) oxygen or water vapor can be used to supply oxygen into the polycrystalline silicon layer. The nitrogen oxides can be more easily controlled to obtain the preferred concentration of oxygen than using oxygen itself or water vapor.

Moreover, instead of using monosilane, a silicon halide such as silicon tetrachloride may be used. However, a higher growing temperature of about 1100° C is required for the decomposition of this material.

Instead of using sunlight, a light emitting diode can be used as an incident photon energy source. In this case, the refractive index of the polycrystalline silicon layer can be readily selected to satisfy equations (1) and (2) with reference to the wavelength of the light emitting diode.

Furthermore, instead of using a coating of silicon dioxide, a transparent resin coating composed of an epoxy resin or the like may be formed on the polycrystalline silicon layer 6 in the solar cell 1. Since the epoxy resin has a refractive index of about 1.5, the refractive index of the polycrystalline silicon layer can be readily selectd to satisfy equation (1) and the resin protects the polycrystalline silicon layer from the outside environment.

Although the invention has been described with respect to several preferred embodiments, it is not to be so limited as changes and modifications can be made which are within the full intended scope as defined by the appended claims.

We claim as our invention:

1. A photo sensitive semiconductor device comprising a semiconductor crystal substrate and an antireflective coating on said substrate, said antireflective coating including a polycrystalline silicon layer containing oxygen in an amount of from 25 to 45 atomic percent.

2. A device according to claim 1 in which said substrate is composed of silicon.

3. A device according to claim 1 in which the thickness of said polycrystalline silicon layer is in the range from 600 to 1,000 Angstroms.

4. A device according to claim 1 in which a silicon dioxide layer is formed over said polycrystalline silicon layer.

5. A device according to claim 1 which includes an epoxy resin coating over at least said polycrystalline silicon layer.

6. A device according to claim 1 which includes at least one P-N junction in said substrate, and means for applying a forward bias to said junction.

7. A device according to claim 1 which includes at least one P-N junction in said substrate, and means for applying a reverse bias to said junction.

8. A semiconductor solar cell comprising a silicon substrate having at least one P-N junction therein and a polycrystalline silicon layer formed on said substrate, said polycrystalline silicon layer containing oxygen in an amount of from 25 to 45 atomic percent.

* * * * *